United States Patent
Yeo

(10) Patent No.: US 6,879,000 B2
(45) Date of Patent: Apr. 12, 2005

(54) ISOLATION FOR SOI CHIP WITH MULTIPLE SILICON FILM THICKNESSES

(75) Inventor: Yee-Chia Yeo, Singapore (SG)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/384,253

(22) Filed: Mar. 8, 2003

(65) Prior Publication Data

US 2004/0173850 A1 Sep. 9, 2004

(51) Int. Cl.$^7$ .................................................. H01L 27/01
(52) U.S. Cl. ........................ 257/347; 257/350; 257/623; 257/500; 257/501; 257/506; 257/524
(58) Field of Search .............................. 257/347, 350, 257/623, 500, 501, 506, 524

(56) References Cited

U.S. PATENT DOCUMENTS

| | | | | |
|---|---|---|---|---|
| 5,973,358 A | * | 10/1999 | Kishi | .......................... 257/324 |
| 6,060,748 A | * | 5/2000 | Uchida et al. | ............... 257/347 |
| 6,114,197 A | * | 9/2000 | Hsu | ........................... 438/199 |
| 6,448,114 B1 | * | 9/2002 | An et al. | ..................... 438/142 |
| 6,548,369 B1 | * | 4/2003 | van Bentum | ............... 438/404 |

* cited by examiner

Primary Examiner—Nathan J. Flynn
Assistant Examiner—Remmon R. Fordé
(74) Attorney, Agent, or Firm—Tung & Associates

(57) ABSTRACT

A semiconductor-on-insulator chip is provided which includes a substrate that is formed of an electrically insulating material; a semiconducting layer overlying the substrate; a first region in the semiconducting layer that has a first thickness, the first region includes silicon regions defined by a shallow trench isolation; and a second region in the semiconducting layer that has a second thickness, the second region includes active regions defined by mesa isolation.

11 Claims, 8 Drawing Sheets

ISOLATION FOR SOI CHIP WITH MULTIPLE SILICON FILM THICKNESSES

FIELD OF THE INVENTION

The present invention generally relates to semiconductor devices and more particularly, relates to silicon-on-insulator devices fabricated in silicon-on-insulator regions having different silicon layer thicknesses and mesa isolation regions in selected active regions.

BACKGROUND OF THE INVENTION

Traditional silicon-on-insulator (SOI) integrated circuits are formed on SOI substrates. SOI substrates typically have a thin layer of silicon, also known as the active layer, disposed on an insulator layer such as a buried oxide layer (BOX). The insulator layer or the buried oxide layer is provided on a silicon substrate. Active devices, such as transistors, are provided in active regions formed within the silicon layer or the active layer. The size and placement of the active regions are defined by isolation regions, such as shallow trench isolation (STI) regions. Active devices in the active regions are isolated from the substrate by the BOX layer. Devices formed on SOI substrates offer many advantages over their bulk counterparts, including absence of reverse body effect, absence of latch-up, soft-error immunity, and elimination of junction capacitance typically encountered in bulk silicon devices. SOI technology therefore enables higher speed performance, higher packing density, and reduced power consumption.

There are generally two types of SOI transistors: partially-depleted (PD) SOI transistor and fully-depleted (FD) SOI transistor. A PD-SOI transistor is formed in an active region with an active layer thickness that is larger than the maximum depletion width. The PD-SOI transistor therefore has a partially depleted body. PD-SOI transistors have the merit of being highly manufacturable, but they suffer from floating body effects. Digital circuits which typically have higher tolerance for floating body effects may employ PD-SOI transistors. A FD-SOI transistor is formed in an active region with an active layer thickness that is smaller than the maximum depletion width. FD-SOI transistors avoid problems of floating body effects with the use of a thinner active layer thickness or a lighter body doping. Generally, analog circuitry performs better when designed using FD-SOI devices than using PD-SOI devices. Since analog and digital circuits may be formed on the same SOI chip, it is advantageous to provide SOI chips with regions suited for digital circuitry and regions suited for analog circuitry. Therefore, it is useful to provide at least two different silicon films or active layer thicknesses on SOI chips. Regions with very thin silicon films may be employed for FD-SOI devices while regions with thicker silicon films may be used for PD-SOI devices. The availability of at least two different silicon films or active layer thicknesses also offers increased flexibility in circuit and device design.

U.S. Pat. No. 5,952,695, issued to Ellis-Monaghan et al, describes a silicon-on-insulator double film structure where a selected region of the active layer is epitaxially grown to a second thickness after device isolation regions are formed. In the patent, the thickness of the epitaxial layer is limited and cannot be too large as it potentially overgrows laterally into the isolation regions and may render isolation regions ineffective.

U.S. Pat. No. 6,222,234B1, issued to Ima, describes a method of forming partially and fully depleted SOI devices on a common substrate. In the patent, two regions of the active layers with different thicknesses are formed after the isolation regions are formed. An active region with a thinner silicon layer is provided for fully-depleted devices, while an active region with a thicker silicon layer is provided for partially-depleted devices.

U.S. Pat. No. 6,414,355B1, issued to An et al, describes a structure for silicon-on-insulator chips with an active layer of non-uniform thickness. U.S. Pat. No. 6,448,114B1, issued to An et al, described several methods of forming silicon-on-insulator chips with a silicon layer or an active layer of non-uniform thickness. The silicon layer or active layer with non-uniform thickness is formed prior to providing isolation structures. In one embodiment of the invention, a selected region of the active layer is etched to form a region with thinner active layer. In another embodiment of the invention, a selected region of the active layer is epitaxially grown to form a region with a thicker active layer. Both U.S. Pat. Nos. 6,414,355B1 and 6,448,114B1 do not address the issue of forming isolation regions for an SOI chip with multiple active layer thicknesses.

Referring initially to FIGS. 1A–1B, wherein crosssections of an example of a silicon-on-insulator (SOI) chip 10 is illustrated. FIG. 1A shows a conventional silicon-on-insulator (SOI) substrate 12 where an insulator layer 14 electrically isolates a silicon active layer 16 from the silicon substrate 12. In the SOI chip 10, as shown in FIG. 1B, the SOI substrate 12 is processed to form a plurality of active regions 18,20 in the active layer 16. active devices 22, such as transistors and diodes, may be formed in the active regions 18,20. Active regions 18,20 are electrically isolated from each other by isolation regions 26. Isolation regions 26 may, for example, be formed of shallow trench isolations. The conventional SOI chip 10 of FIG. 1B features an active layer 16 of uniform thickness. The uniform active layer thickness and the planar surface 28 of the SOI substrate 10 simplify the formation process of the isolation regions 26. At present, commercial products using SOI technology employ a uniform active layer thickness and shallow trench isolation.

It is advantageous to provide at least two different silicon film thicknesses on the SOI substrate. Referring now to FIG. 2A, a cross-section of a processed SOI substrate 10 with two different silicon films or active layer thicknesses is illustrated. In the SOI substrate 10 of FIG. 2A, the active layer 16, with multiple active layer thicknesses, is formed prior to the formation of isolation regions 26. In a first region 32 of the active layer 26, the active layer 26 has a first thickness tSi1. In a second region 34 of the active layer 16, the active layer has a second thickness tSi2. It is obvious that this may be extended to include additional regions with additional silicon film thicknesses, for example, a third region 34 of the active layer 16 with a third thickness tSi3, and so on. The availability of at least two different active layer thicknesses offers the option of using a thinner active layer thickness for devices such as fully-depleted SOI transistors and a thicker active layer thickness for devices such as partially-depleted SOI transistors. Active regions with thicker active layer thickness may also be used for forming devices like diodes or lubistors, the current drive of which is proportional of the active layer thickness. For example, diodes or lubistors are used in SOI circuits for electrostatic discharge (ESD) protection.

The employment of an active layer 16 with at least two thicknesses may result in a non-planar silicon surface 28, as schematically illustrated in FIG. 2A. Due to the non-planar nature of the silicon surface, it is difficult to provide isolation regions 26 in different active regions 18,20 with different active layer thicknesses. That is, it is difficult to form the isolation regions as depicted in the cross-section of FIG. 2B. Firstly, the isolation trench depths of FIG. 2B differ in different regions. Secondly, the top surface of the isolation region is provided at different heights. Since isolation structures such as shallow trench isolation utilizes chemical mechanical polishing (CMP) to achieve planarity in the top surface of the isolation regions, CMP may not be directly applied to achieve the isolation structure shown in FIG. 2B.

It is therefore an object of the present invention to provide a method for forming isolation regions for SOI chips with multiple active layer thicknesses.

It is another object of the present invention to provide mesa isolation in a portion of an SOI chip with multiple active layer thicknesses.

It is a further object of the invention to provide conventional isolation regions, such as shallow trench isolation regions, in a portion of an SOI chip with multiple active layer thicknesses.

It is still another object of the invention to provide mesa isolation in a plurality of active regions with different active layer thicknesses.

SUMMARY OF THE INVENTION

In accordance with the present invention, a semiconductor-on-insulator chip and a method for fabricating the chip are disclosed.

In a preferred embodiment, a semiconductor-on-insulator chip is provided which includes a substrate that is formed of an electrically insulating material; a semiconducting layer overlying the substrate; a first region in the semiconducting layer that has a first thickness, the first region includes active regions defined by a shallow trench isolation; and a second region in the semiconducting layer that has a second thickness, the second region includes active regions defined by mesa isolation.

In the semiconductor-on-insulator chip, the semiconducting layer may be formed of silicon, or formed of silicon and germanium. The electrically insulating material may include silicon oxide. The first thickness of the first region may be larger than the second region. The first thickness may be in the range between 100 angstroms and 2000 angstroms, while the second thickness may be in the range between 5 angstroms and 200 angstroms.

The present is further directed to a semiconductor-on-insulator chip that includes a substrate formed of an electrically insulating material; a semiconducting layer overlying the substrate; a first region in the semiconducting layer that has a first thickness, the first region includes active regions defined by mesa isolation; and a second region in the semiconducting layer that has a second thickness, the second region may include active regions defined by mesa isolation.

In the semiconductor-on-insulator chip, the semiconducting layer may include silicon, or may include silicon and germanium. The electrically insulating material may include silicon oxide. The first thickness of the first region may be greater than the second thickness of the second region. The first thickness may be in the range between 5 angstroms and 1000 angstroms, while second thickness may be in the range between 5 angstroms and 1000 angstroms.

The present invention is still further directed to a method for forming a silicon-on-insulator chip which can be carried out by the operating steps of providing a substrate that has a silicon layer overlying an electrically insulating material; the silicon layer may include a first region that has a first thickness and a second region that has a second thickness, the first thickness is greater than the second thickness; forming a mesa isolation in the second region of the silicon active layer; forming a shallow trench isolation in the first region of the silicon active layer; and forming an active device.

The method for forming a silicon-on-insulator chip may further include the step of forming the first region of the silicon active layer to a first thickness in the range between 100 angstroms and 2000 angstroms, or forming the first region of the silicon active layer to a second thickness in the range between 5 angstroms and 200 angstroms. The forming step for the mesa isolation may include the sub-steps of providing a first isolation mask exposing a portion of the second region of the silicon active layer; etching at least one trench in the portion of the second region of the silicon active layer forming silicon islands or mesa structures; and removing the first isolation mask.

The forming step for the shallow trench isolation may include the sub-steps of providing a second isolation mask exposing a portion of the first region of the silicon active layer; etching at least one trench in the portion of the first region of the silicon active layer, the at least one trench includes at least two sidewalls; forming a silicon oxide layer on the at least two sidewalls of the at least one trench; filling the at least one trench with silicon oxide; annealing the silicon oxide at a temperature higher than 500 degrees Celsius in a first annealing step; removing excess silicon oxide by a chemical mechanical polishing process; annealing the silicon oxide at a temperature higher than 500 degrees Celsius in a second annealing step; and removing the second isolation mask.

The present invention is still further directed to a method for forming a silicon-on-insulator chip which can be carried out by the operating steps of providing a silicon-on-insulator substrate including a silicon active layer overlying an insulator layer, the silicon active layer further includes a first region that has a first thickness and a second region that has a second thickness, the first thickness is greater than the second thickness; forming a shallow trench isolation in the first region; forming a mesa isolation in the second region; and forming active devices.

The method for forming a silicon-on-insulator chip may further include the step of forming the first region of the silicon active layer to a first thickness in the range between 100 angstroms and 2000 angstroms, or the step of forming the first region of the silicon active layer to a second thickness in the range between 5 angstroms and 200 angstroms. The forming step for the mesa isolation may further include the sub-steps of providing a first isolation mask exposing a portion of the second region of the active layer; etching at least one trench in the portion of the second region of the silicon active layer forming silicon islands or mesa structures; and removing the first isolation mask. The forming step for the shallow trench isolation may further include the sub-steps of providing a second isolation mask exposing a portion of the first region of the silicon active layer; etching at least one trench in the portion of the first region of the silicon active layer, the at least one trench includes at least two sidewalls; forming a silicon oxide layer on the at least two sidewalls of the at least one trench; filling the at least one trench with silicon oxide; annealing the silicon oxide at a temperature higher than 500 degrees Celsius in a first annealing step; removing excess silicon oxide by a chemical mechanical polishing process; annealing the silicon oxide at a temperature higher than 500 degrees Celsius in a second annealing step; and removing the second isolation mask.

The present invention is still further directed to a method for forming a silicon-on-insulator chip which includes the operating steps of providing a silicon-on-insulator substrate that includes a silicon active layer overlying an insulator layer, the silicon active layer may further include a first region that has a first thickness and a second region that has a second thickness, the first thickness is greater than the second thickness; forming mesa isolation in the first and second regions; and forming active devices in the first and second regions.

The method for forming a silicon-on-insulator chip may further include the steps of forming the first region of the silicon active layer to a first thickness in the range between 5 angstroms and 1000 angstroms, or the step of forming the second region of the silicon active layer to a second thickness in the range between 5 angstroms and 1000 angstroms. The forming step for the mesa isolation may further include the sub-steps of providing an isolation mask exposing a portion of the first and second regions of the active layer; etching trenches in a portion of the first and second regions of the active layer forming silicon islands or mesa structures; and removing the isolation mask.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

In the present invention, a SOI technology with different silicon thicknesses and method for providing isolation between the active regions are disclosed.

In the invention, the shortcomings of the prior art are circumvented by a structure and process wherein a separate and simple isolation scheme is used for active regions with thinner active layer thickness. Therefore, the problems of using a specific isolation process for regions of different active layer thicknesses are avoided. Specifically, the invention describes the use of mesa isolation for active regions with thin active layer thickness and shallow trench isolation for active regions with thick active layer thickness.

Figure 1A:
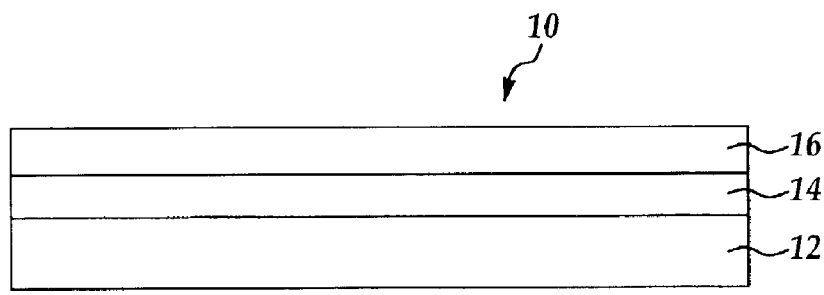
FIGS. 1A and 1B are enlarged, cross-sectional views of a conventional silicon-on-insulator substrate with active devices formed in active regions.
Figure 1B:
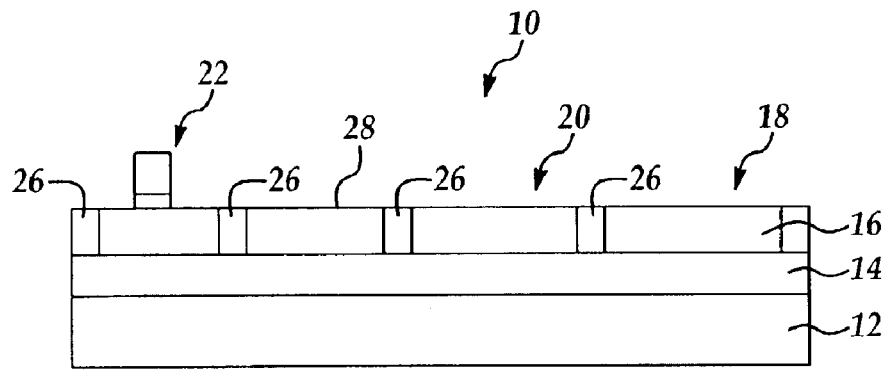
Figure 2A:
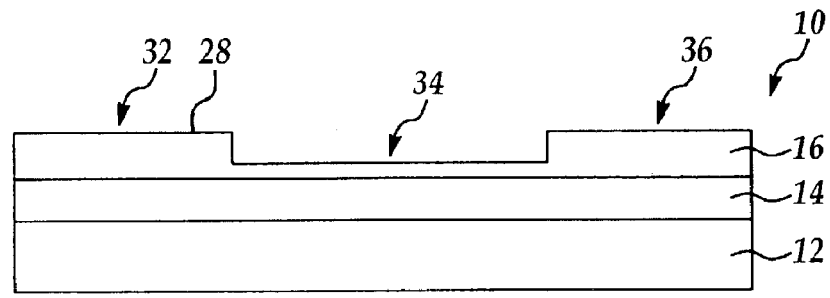
FIGS. 2A and 2B are enlarged, cross-sectional views of a conventional silicon-on-insulator substrate with non-uniform active layer thickness formed prior to the formation of isolation regions and after the formation of isolation regions, respectively.
Figure 2B:
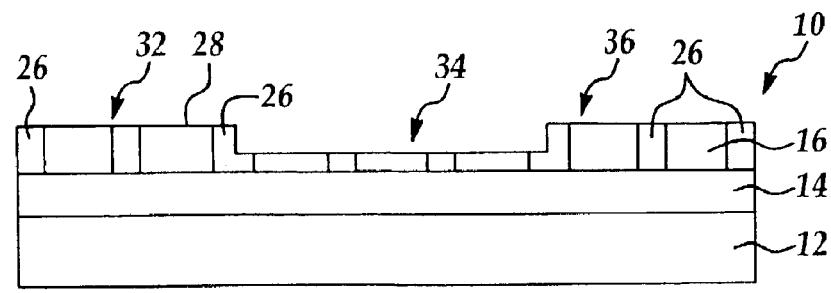
Figure 3A:
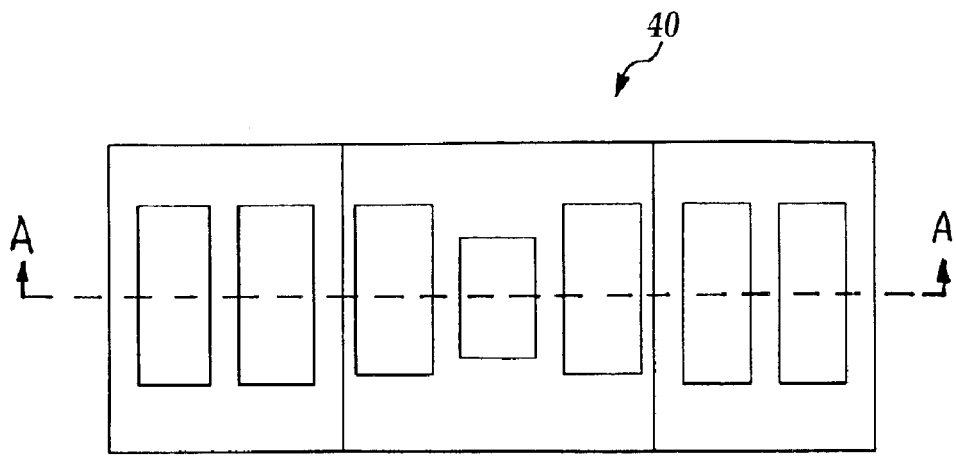
FIGS. 3A and 3B are an enlarged plane view and a cross-sectional view, respectively, taken along line A—A of a silicon-on-insulator substrate with non-uniform active layer thickness and mesa isolation separating the active regions.
Figure 3B:
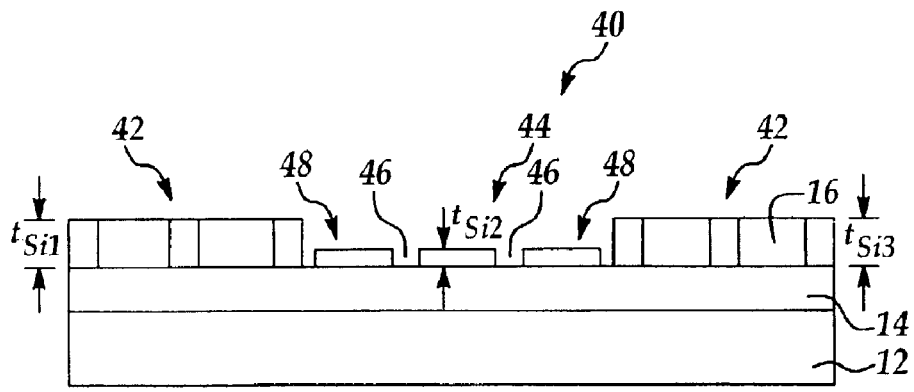

Referring now to FIG. 3A, a plane view of a SOI substrate 40 with multiple active layer thicknesses and isolation schemes is shown. An enlarged, cross-sectional view of the SOI substrate 40 taken along line A—A of FIG. 3A is illustrated in FIG. 3B. A first region 42 of the active layer 16 has a first active layer thickness tSi1 and a second region 44 of the active layer has a second active layer thickness tSi2.

Active regions with thin silicon films, such as active regions 48 in the second region 44 of the active layer 16 are isolated from each other by forming trenches 46 between them. The trenches 46 divide the active layer 16 in that region into islands or silicon mesa structures. The mesa isolation method thus cuts electrical connection between adjacent active regions by removing part of the active layer in the SOI substrate 40.

Figure 4:
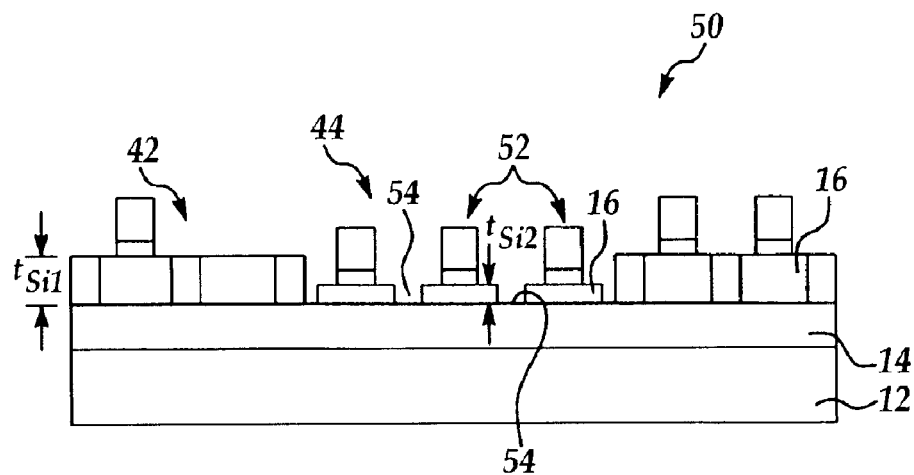
FIG. 4 is an enlarged, cross-sectional view of a silicon-on-insulator chip with non-uniform active layer thickness illustrating active devices formed in the active regions.

Referring now to FIG. 4, the cross-sectional view of an SOI chip 50 is shown where active devices are formed in the various active regions. Active devices 52, formed in the active regions with a thinner active layer, are isolated from each other by mesa isolation 54. In the preferred embodiment, the thickness tSi2 of the thinner active layers may range from 5 angstroms to 200 angstroms. The semiconductor material constituting the active layer 16 is preferably silicon, but may also be any other elemental semiconductor such as germanium, or any alloy semiconductor such as silicon-germanium, or any compound semiconductor such as gallium arsenide or indium phosphide. In the case where the active layer is silicon, the silicon may be in its relaxed state or may be strained silicon. Active devices formed in the active regions with a thicker active layer are isolated from each other by shallow trench isolation, for example. Active layers isolated from each other by isolation structures such as shallow trench isolation may have a thickness tSi1 in the range between 100 angstroms and 2000 angstroms.

Various methods for forming the mesa isolation and shallow trench isolation in the same SOI substrate with multiple active layers or silicon film thicknesses are now described.

Figure 5:
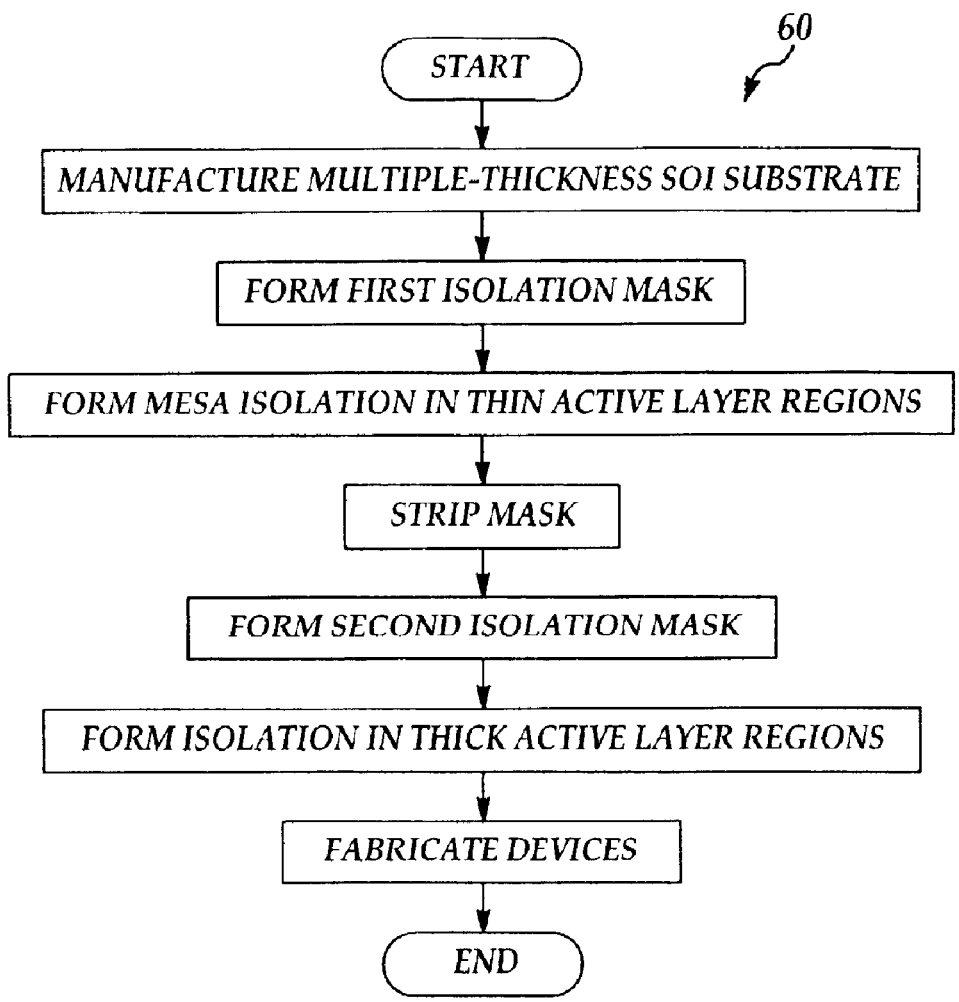
FIG. 5 is a block diagram showing the process flow for the preferred embodiment of the present invention method for fabricating a silicon-on-insulator chip with active layers of multiple thicknesses.
Figure 6A:
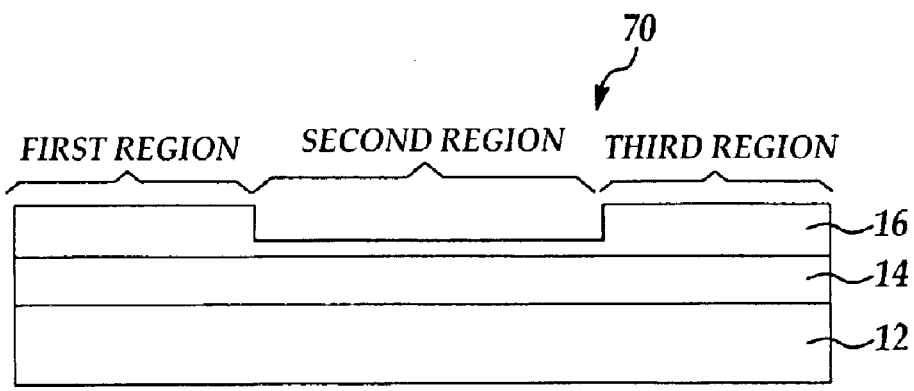
FIGS. 6A–6I are enlarged, cross-sectional views illustrating the present invention process steps for forming a silicon-on-insulator structure with active devices isolated by both shallow trench isolations and mesa isolations.
Figure 6B:
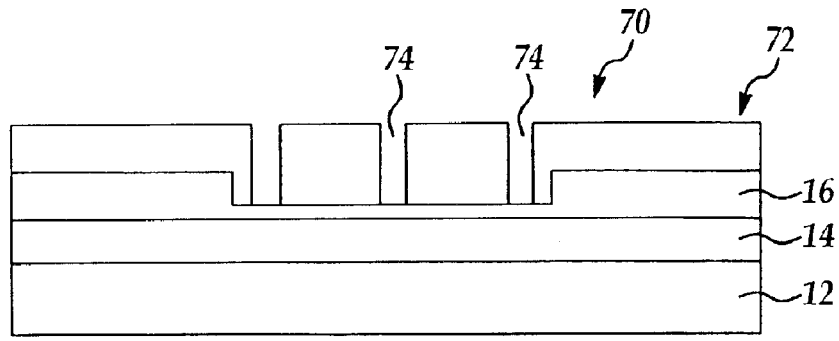

In a first embodiment, an SOI substrate with multiple active layer thicknesses is first provided. FIG. 5 shows a flowchart 60 of a method of manufacturing an SOI chip having active layer of multiple thicknesses and isolated using two different isolation methods. The starting material is an SOI substrate 70 comprising at least two different active layer thicknesses, including a first portion of a first thickness and a second portion of a second thickness (FIG. 6A). It is obvious that the substrate 70 may have a third portion of a third thickness, and so on. A first isolation mask 72 is formed on the SOI substrate. The first isolation mask 72 may be formed of a suitable masking material such as photoresist, silicon oxide, silicon nitride, or combination of the above. The first isolation mask may or may not have any conformal topology, i.e. it can be conformal in which case its thickness is uniform, or it can be non-conformal in which case its thickness is non-uniformal. The first isolation mask is patterned to expose regions 74 where trenches 76 are to be formed in the second portion of the active layer 16 (FIG. 6B).

Figure 6C:
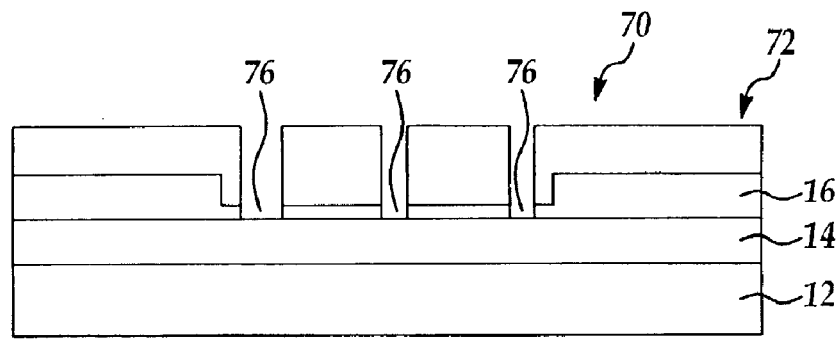
Figure 6D:
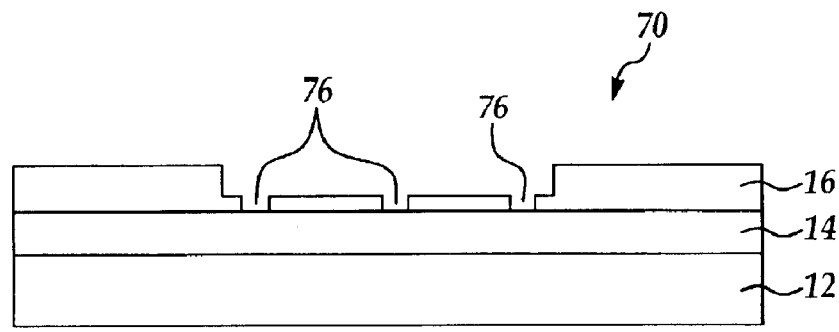

The trenches in the second portion of the active layer results in the formation of silicon islands or silicon mesa structures. The etching of trenches in the silicon active layer may be performed by etching processes such as reactive ion etching (RIE) where a gas mixture of sulfur hexafluoride ($SF_6$), helium (He), and oxygen ($O_2$) is used. FIG. 6C shows a cross-sectional view of the wafer after the trenches are etched. Therefore, in the first embodiment, the first isolation mask defines the mesa isolation. The first isolation mask is then removed, as shown in FIG. 6D, which clearly shows the silicon islands or mesa structures.

Figure 6E:
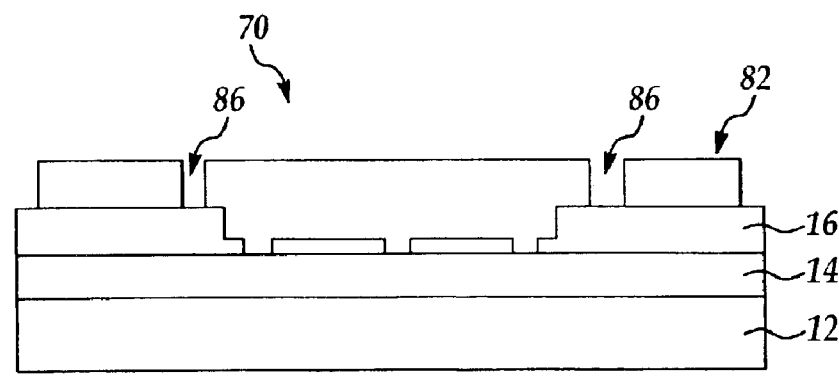

Next, the second isolation structure is formed. The second isolation structure can be formed using a shallow trench isolation (STI) process known in the art. The following is a description of a shallow trench isolation process commonly used. A second isolation mask 82 is first provided. The second isolation mask 82 may be formed of a suitable masking material, such as silicon oxide and silicon nitride. The second isolation mask 82 is preferably an oxidation resistant material such as a silicon nitride layer overlying a pad silicon oxide layer. The silicon nitride on silicon oxide stack may be formed by dry thermal oxidation to form a layer of pad silicon oxide followed by chemical vapor deposition of silicon nitride using dichlorosilane and ammonia as reaction gases. The second isolation mask 82 may be patterned and etched using reactive ion etching with sulfur hexafloride, helium, and trifluoromethane as etching gas. The patterned second isolation mask exposes regions where an isolation structure such as a shallow trench isolation 86 is to be formed, as shown in FIG. 6E.

Figure 6F:
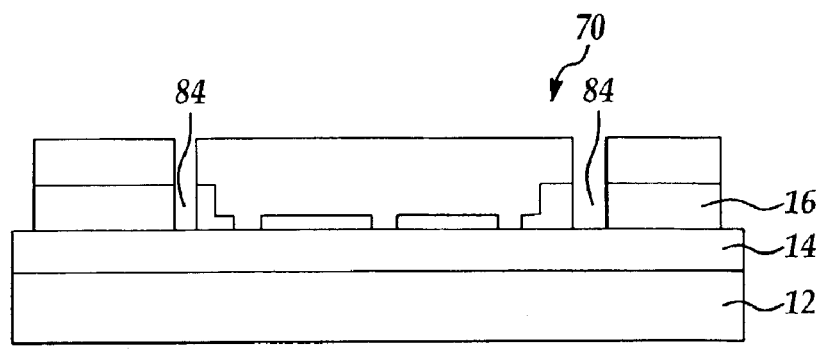
Figure 6G:
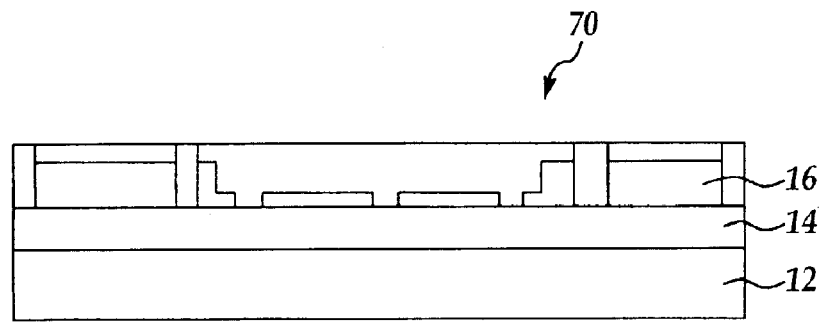
Figure 6H:
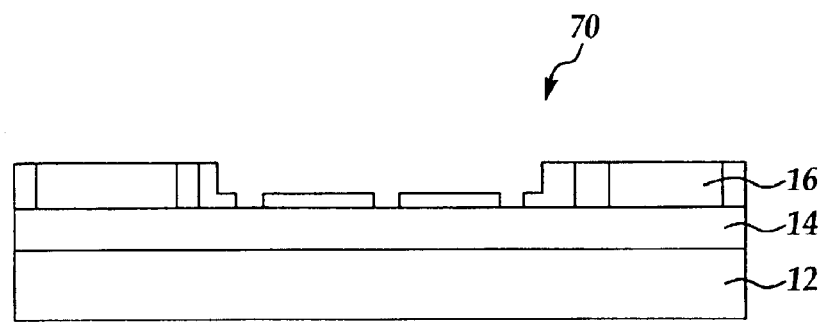
Figure 6I:
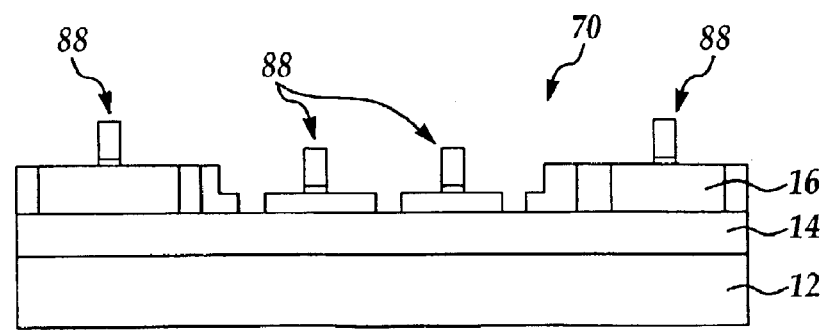

Trenches are etched in the exposed regions in the first portion of the active layer 16, as shown in FIG. 6F. A thermal oxidation may be performed to grow silicon oxide on the sidewalls of the trenches 84. The trenches 84 are then filled with a filling material such as silicon oxide. The silicon oxide may be deposited by chemical vapor deposition. The filled silicon oxide may be annealed for densification. The substrate 70 may be planarized by chemical mechanical polishing (CMP) to give the cross-section as shown in FIG. 6G. The remaining second isolation mask 82 is then removed by an appropriate etchant. If the second isolation mask 82 is silicon nitride on silicon oxide stack, it may be removed by etching in hot phosphoric acid followed by etching in hydrofluoric acid. This completes the formation of the shallow trench isolation process. The resulting cross-section is shown in FIG. 6H. Active devices 88 are then fabricated in the active regions as shown in FIG. 6I.

Figure 7:
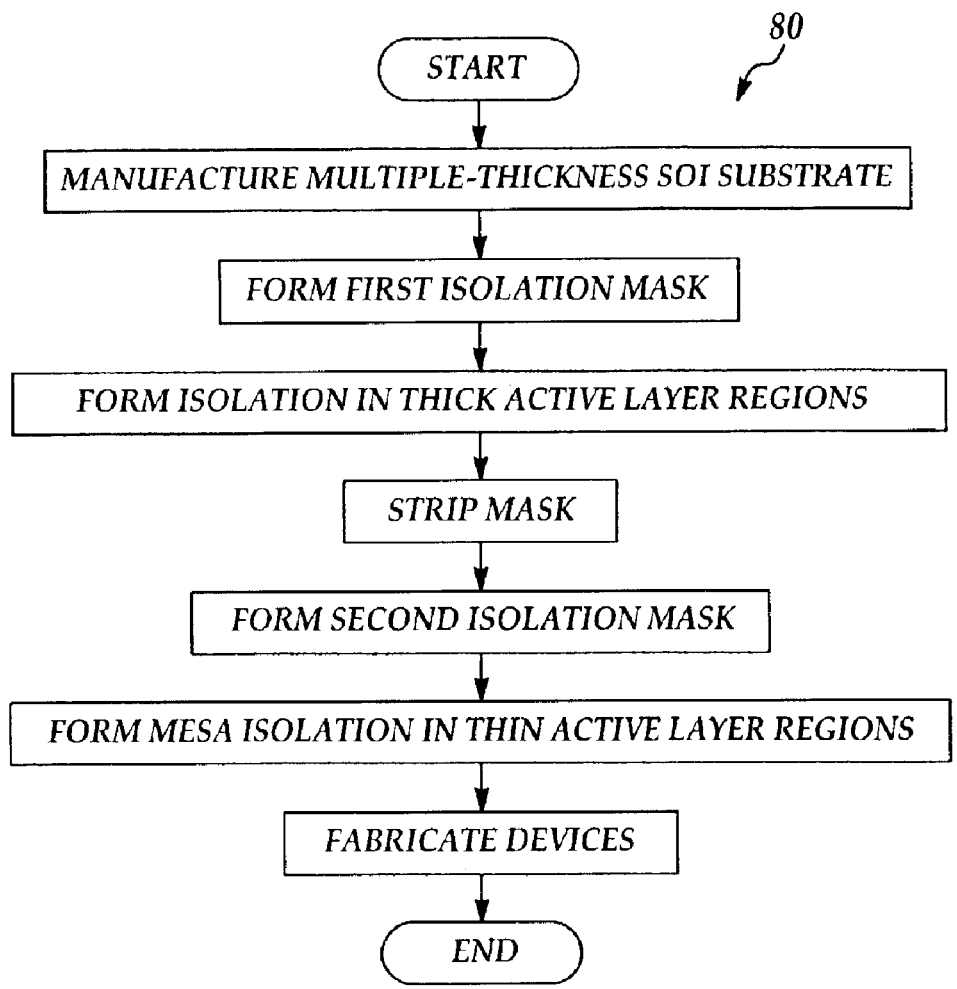
FIG. 7 is a block diagram showing the process flow of the present invention second embodiment method for fabricating a silicon-on-insulator chip with active layers of multiple thicknesses and isolations by different techniques.
Figure 8A:
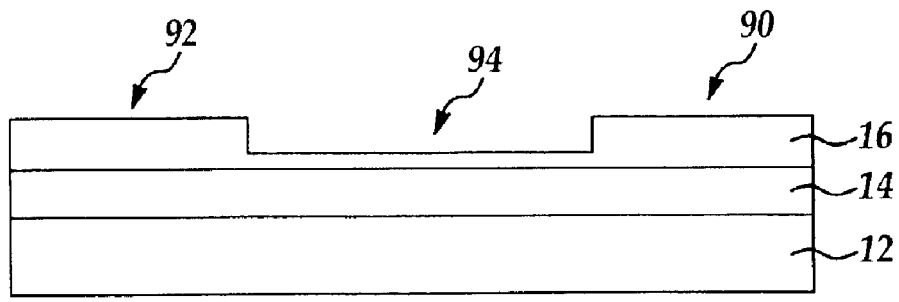
FIGS. 8A–8I are enlarged, cross-sectional views illustrating the present invention second embodiment process for fabricating silicon-on-insulator structures.
Figure 8B:
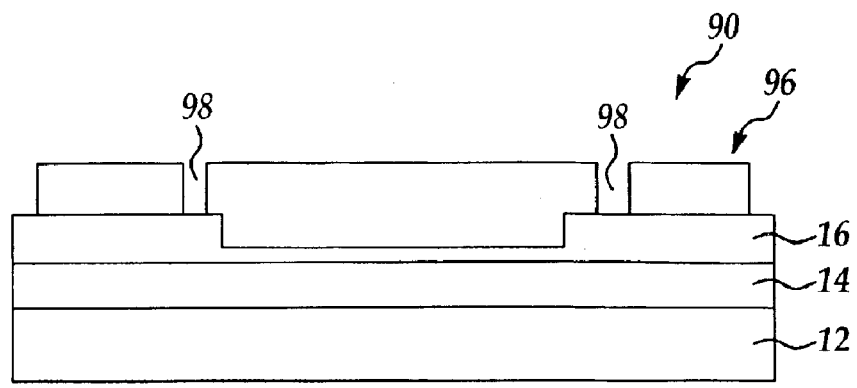
Figure 8C:
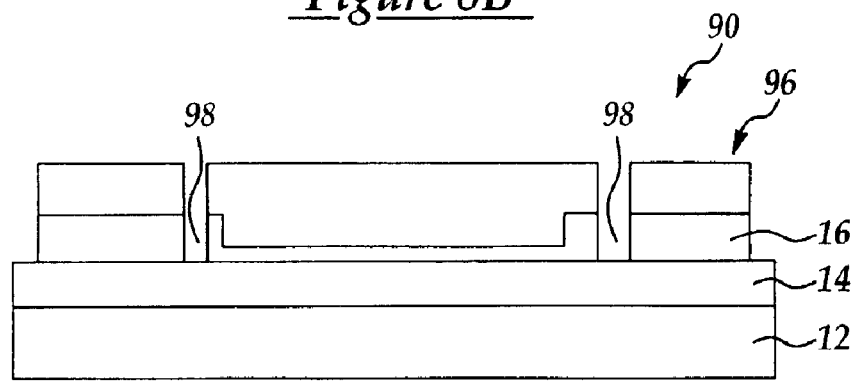
Figure 8D:
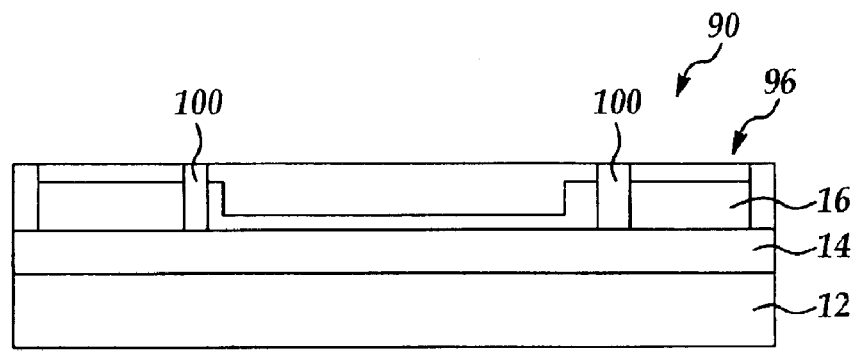
Figure 8E:
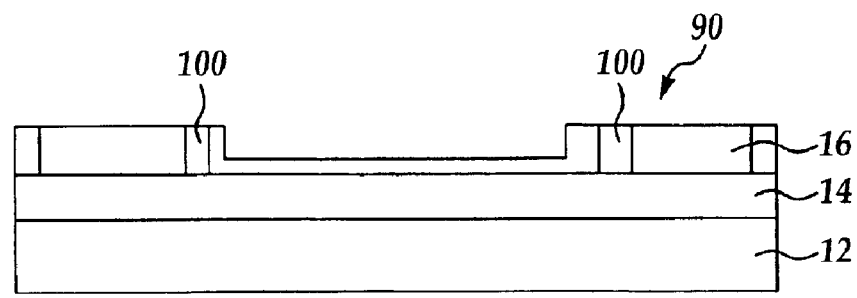
Figure 8F:
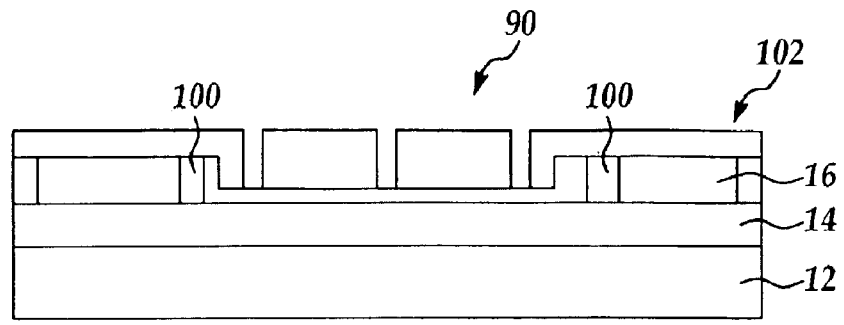
Figure 8G:
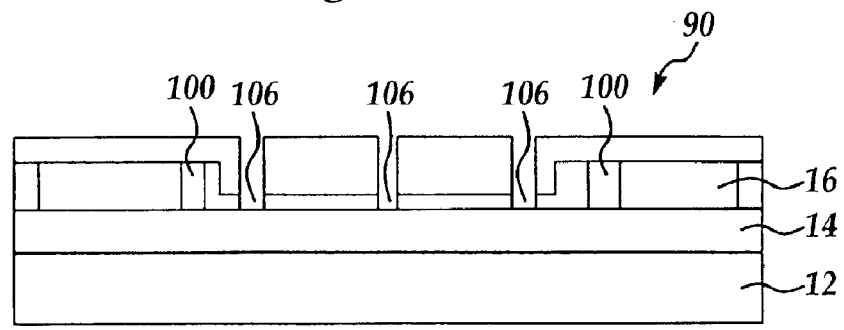
Figure 8H:
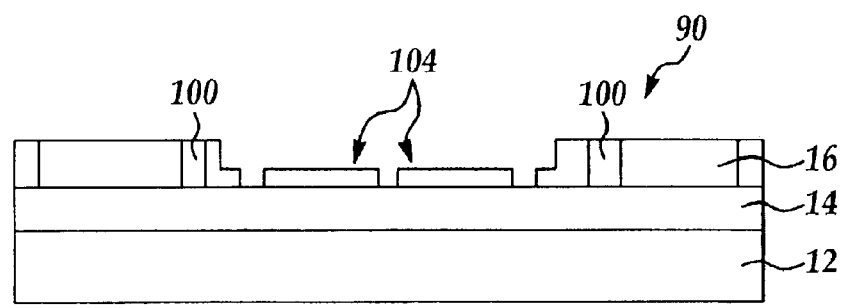
Figure 8I:
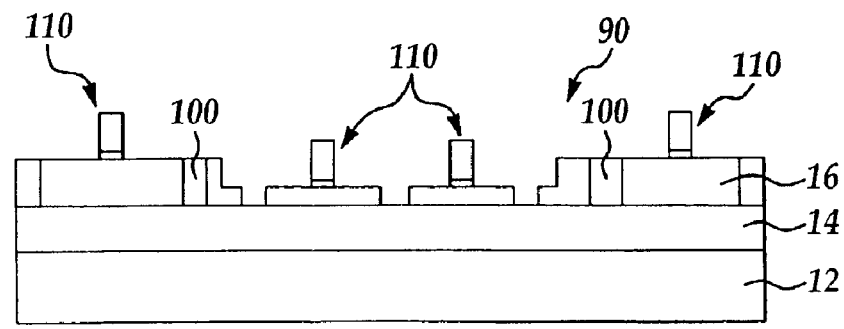

In a second embodiment, the shallow-trench isolation process is performed first, and then the mesa isolation process. FIG. 7 shows a flowchart 80 for the second embodiment process for fabricating an SOI chip with active layers of multiple thicknesses and isolation by two different isolation methods. An SOI substrate 90 comprising at least two different active layer thicknesses, including a first portion 92 of a first thickness and a second portion 94 of a second thickness, is provided in FIG. 8A. A first isolation mask 96 is provided on the substrate 90 and patterned to expose regions 98 in the first portion of the active layer 16 where shallow trench isolation structures 100 are to be formed, as shown in FIG. 8B. The first isolation mask material is preferably a silicon nitride layer overlying a silicon oxide layer. A shallow trench isolation process, as previously described, the first embodiment is used to isolate active regions in the first portion 92 of the active layer 16. The shallow trench isolation process is schematically shown in FIGS. 8B–8E. Therefore, in the second embodiment, the first isolation mask 96 defines the shallow trench isolation structure. A second isolation mask 102 is then deposited and patterned to define the silicon islands or mesa structures 104, as shown in FIG. 8F. A silicon etch process is used to form trenches to define the silicon islands 104 isolated by mesa isolation 106, as shown in FIG. 8G. The second isolation mask 102 is then removed (FIG. 8H). Active devices are then fabricated (FIG. 8I).

In a third embodiment, mesa isolation may be provided in a plurality of active regions with different thicknesses. For example, mesa isolation may be provided for active regions with at least two different thicknesses, it is not restricted to active regions of a single thickness. In this case, the thicknesses of the active regions isolated by mesa isolation may range from 5 angstroms to 1000 angstroms.

While the present invention has been described in an illustrative manner, it should be understood that the terminology used is intended to be in a nature of words of description rather than of limitation.

Furthermore, while the present invention has been described in terms of a preferred and two alternate embodiments, it is to be appreciated that those skilled in the art will readily apply these teachings to other possible variations of the inventions.

The embodiment of the invention in which an exclusive property or privilege is claimed are defined as follows.

What is claimed is:

1. A semiconductor-on-insulator chip comprising:
   a substrate comprising of a semiconducting layer overlying an electrically insulating layer;
   a first region in said semiconducting layer having a first thickness in the range of 100 angstroms to 2000 angstroms, said first region comprises active regions separated by shallow trench isolation regions; and
   a second region in said semiconducting layer having a second thickness in the range of 5 angstroms to 200 angstroms, said second region comprises active regions defined by mesa isolation.

2. The semiconductor-on-insulator chip of claim 1, wherein said semiconducting layer comprises silicon.

3. The semiconductor-on-insulator chip of claim 1, wherein said semiconducting layer comprises silicon and germanium.

4. The semiconductor-on-insulator chip of claim 1, wherein said electrically insulating material comprises silicon oxide.

5. The semiconductor-on-insulator chip comprising:
   a substrate comprising of a semiconducting layer overlying an electrically insulating layer;
   a first region in said semiconducting layer having a first thickness in the range of 5 angstroms to 1000 angstroms, said first region comprises active regions defined by mesa isolation; and
   a second region in said semiconducting layer having a second thickness in the range of 5 angstroms to 200 angstroms, said second region comprises active regions defined by mesa isolation.

6. The semiconductor-on-insulator chip of claim 5, wherein said semiconducting layer comprises silicon.

7. The semiconductor-on-insulator chip of claim 5, wherein said semiconducting layer comprises silicon and germanium.

8. The semiconductor-on-insulator chip of claim 5, wherein said electrically insulating material comprises silicon oxide.

9. The semiconductor-on-insulator chip of claim 1, wherein said semiconducting layer comprises silicon.

10. The semiconductor-on-insulator chip of claim 1, wherein said semiconducting layer comprises indium phosphide.

11. The semiconductor-on-insulator chip of claim 1, wherein said semiconducting layer comprises strained silicon.

* * * * *